US008196510B2

(12) United States Patent
Kuczynski et al.

(10) Patent No.: US 8,196,510 B2
(45) Date of Patent: Jun. 12, 2012

(54) METHOD FOR THE PRODUCTUION OF A FLEXOGRAPHIC PLATE AND FLEXOGRAPHIC PLATE OBTAINED ACCORDING TO SAID METHOD

(76) Inventors: Jerzy Kuczynski, Zillisheim (FR); Gérard Rich, Orschwihr (FR)

( * ) Notice: Subject to any disclaimer, the term of this patent is extended or adjusted under 35 U.S.C. 154(b) by 1155 days.

(21) Appl. No.: 10/500,635

(22) PCT Filed: Jan. 8, 2003

(86) PCT No.: PCT/FR03/00037
§ 371 (c)(1),
(2), (4) Date: Mar. 30, 2005

(87) PCT Pub. No.: WO03/058349
PCT Pub. Date: Jul. 17, 2003

(65) Prior Publication Data
US 2005/0150407 A1  Jul. 14, 2005

(30) Foreign Application Priority Data
Jan. 11, 2002  (FR) ...................................... 02 00329

(51) Int. Cl.
*G03F 7/00* (2006.01)

(52) U.S. Cl. ................... 101/401.1; 101/463.1; 430/306

(58) Field of Classification Search .................. None
See application file for complete search history.

(56) References Cited

U.S. PATENT DOCUMENTS

| 3,264,103 | A  |   | 8/1966 | Cohen et al. |
|-----------|----|---|--------|--------------|
| 5,317,080 | A  | * | 5/1994 | Arimatsu et al. ............. 528/332 |
| 5,386,268 | A  |   | 1/1995 | Ohlig et al. |
| 5,425,693 | A  |   | 6/1995 | Gardner et al. |
| 5,706,731 | A  |   | 1/1998 | Francille et al. |
| 5,752,444 | A  |   | 5/1998 | Lorig |
| 5,795,647 | A  | * | 8/1998 | Robinson et al. ............. 428/329 |
| 6,541,183 | B2 | * | 4/2003 | Teng ............................. 430/303 |
| 2003/0054153 | A1 |   | 3/2003 | Kuczynski et al. |

FOREIGN PATENT DOCUMENTS

| EP | 0 469 735 | 2/1992 |
| EP | 1 132 776 | 9/2001 |
| FR | 2803245 A1 * | 7/2001 |
| WO | WO 98/53370 | 11/1998 |

OTHER PUBLICATIONS

Jeng, et al., "Curing Characteristics of the Photopolymer Used in the Solid Laser-Diode Plotter RP System", *Int J Adv Manuf Technol*, 2001, pp. 535-542.
Toshiyuki Urano, "Laser Diode (LD) Imagings and Photopolymers for LD Imagings", *Proceedings of SPIE*, vol. 4274, 2001, pp. 18-28.

* cited by examiner

*Primary Examiner* — Joshua D Zimmerman
(74) *Attorney, Agent, or Firm* — Carmody & Torrance LLP

(57) ABSTRACT

A method for producing a flexographic plate that includes a base layer and a layer of a photosensitive material fixed on the base layer. An image is produced on the photosensitive layer by selective reticulation. Areas to be reticulated are exposed to amplitude-modulated laser light with a wavelength ranging from 390 to 410 nm, which scans the surface of the photosensitive layer. The non-reticulated areas are then removed.

28 Claims, 1 Drawing Sheet

METHOD FOR THE PRODUCTUION OF A FLEXOGRAPHIC PLATE AND FLEXOGRAPHIC PLATE OBTAINED ACCORDING TO SAID METHOD

FIELD OF INVENTION

The invention relates to a method for the production of a flexographic printing plate, particularly by digital means, which has a base layer and a layer of light sensitive material, according to which an image is produced on the light sensitive layer by bringing about a selective crosslinking by insolation of the zones which are to be crosslinked using light with a predetermined wavelength and by removal of the non-crosslinked zones. The invention also relates to a flexographic printing plate obtained according to this method.

BACKGROUND

Methods and flexographic printing plates are already known. A known method for production of a flexographic printing plate consists of insolating with ultraviolet light a photo-polymer of elastomeric nature through a mask which is opaque with respect to ultraviolet (UV) light. This method has the disadvantage that the mask is produced digitally by selective ablation in situ of a surface layer which is opaque with respect to UV with a laser operating with infrared light.

According to another method, the image is produced by direct writing of the photo-polymer plates using amplitude modulated ultraviolet sources. These sources can be lasers typically operating at wavelengths of 350 to 370 nm. These sources have the major disadvantages of having an exorbitant cost, of having a low energy efficiency and also low available power, of using optics with power losses and of being expensive to maintain.

Yet another known method involves the use of photo-polymers which are sensitive to visible light with, for example, silver base technologies in the manner of photography films. This method is very limiting because it requires strict measures of protection against daylight.

SUMMARY OF THE INVENTION

The invention aims to propose a method which palliates the disadvantages just disclosed.

In order to attain this aim, in the method according to the invention for the production of the image, an amplitude modulated laser light is used, having a wavelength is on the order of 390 to 410 nm, and which is made to sweep the surface of the plate.

According to a of the invention, laser sources consisting of a bundle of diodes functioning at wavelengths around 405 nm are used.

According to of the invention, the removal of the non-crosslinked zones is done by liquefying of these zones by thermal means, without the use of solvents.

The arrangement of the flexographic printing plate according to the invention includes a tubular sleeve on a rigid support, which has a composite base and, attached on this base, a layer made of light sensitive material which is free of solvents.

BRIEF DESCRIPTION OF DRAWINGS

The invention will be better understood and other aims, characteristics, details and advantages of it will appear more clearly in the following description in reference to the appended diagrammatic drawings given only by way of example illustrating an embodiment of the invention and in which.

DETAILED DESCRIPTION

Figure 1:
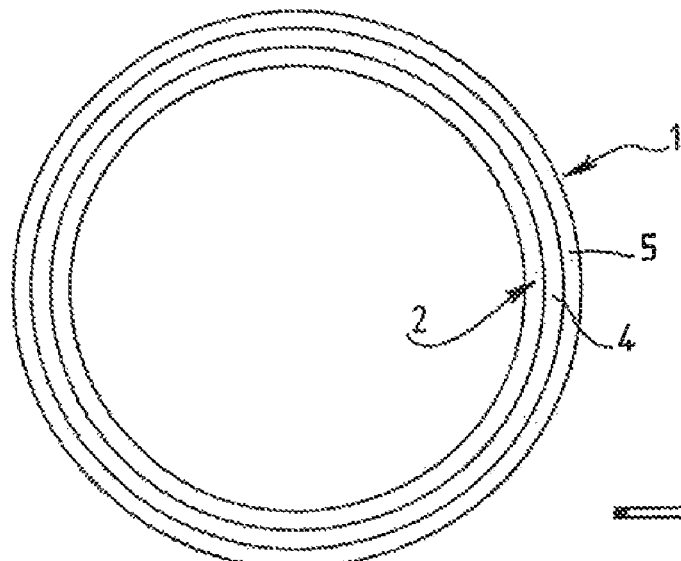
FIG. 1 is a diagrammatic radial view in section of the flexographic printing plate arrangement in the form of a sleeve according to the invention.

A flexographic printing plate according to the invention is advantageously present in the form of tubular sleeve 1 mounted on rigid support 2 which is known. Plate 1 has composite base 4 of suitable thickness, between approximately 0.2 and 40 mm, preferably 0.3 mm, and layer 5 of light sensitive material with a thickness between approximately 0.5 and 2 mm, preferably 1.5 mm, which is attached to the exterior surface of base 4. This sleeve can be manufactured using an extrusion method or any other known method. According to another variant, it could be produced by thermally projecting pre-formulated powder onto a support cylinder or sleeve, for example, made of a composite material or any other appropriate material.

It should be noted that the exterior surface of the light sensitive layer can be machined and polished in order to ensure strict compliance of the dimensions.

According to the invention, the image on the light sensitive layer is produced by direct writing using light with a wavelength in a range on the order of 390 to 410 nm approximately, which is emitted by a laser modulated in terms of amplitude by software and which sweeps the surface of the plate. In this way, the light used is situated between the boundary of the visible and the ultraviolet. Preferably, the laser source consists of a bundle of diodes functioning at wavelengths around 405 nm.

As light sensitive material which is sensitive to such a laser, materials are used which contain one or more high molecular weight polymers, functionalized monomers or oligomers, photo-initiators, reactive or non-reactive diluents, inhibitors and protective agents and pigments. The diluents and the oligomers generally allow adjustment of the viscosity.

The photo-initiators used must of course be sensitive to the light which is used. It would be possible to consider, for example, photo-initiators commercially available under the trade names Irgacure 819 and 1850 of Ciba, Genocure CQ of Rahn, Darocure TPO of Ciba, TPO lucirin of BASF, Genocure TPO of Rahn and Quantacure CPTX of Rahn.

These photoinitiators are capable of undergoing a photo-reaction that destroys light absorption, which produces a bleaching effect that renders already crosslinked zones of the light sensitive layer transparent to the laser light. This enables a progressively deeper penetration of the light into the light sensitive layer in order to allow uniform crosslinking throughout the thickness of the layer, even in the case of thick layers.

The photo-polymer used can have two or more complementary crosslinking systems, namely a main system used for creating the image and a complementary system for completing the crosslinking and increasing the chemical and mechanical resistance. Another system could generate different compressibilities. Such a system is described in the document FR 2 803 245.

The photo-polymers used can be partially crosslinked in order to adjust the viscosity and to prevent cold creep during prolonged periods of storage or transport. It should also be noted that the photo-polymer could be sensitized by a flash of light before the laser treatment in order to increase the effectiveness of the laser.

Preferably, a photo-polymer which is sensitive to the laser light used in the context of the invention is a material based on SBS or containing SBS, SIS or else made of SEBS and with a hardness between approximately 60 and 70 ShA.

Another particularity of the invention lies in the fact that the washing of the zones not crosslinked by exposure to the laser light is preferably done by a known thermal method described in the document U.S. Pat. No. 3,264,103. For this purpose, the sleeve is heated to a temperature ensuring the liquefying of the non-crosslinked zones, allowing these zones to be eliminated without solvents. To this end, the material not crosslinked by the laser light could be specially formulated by known means in order to have a great variation of viscosity at a temperature between 60 and 140° C. Ranges of viscosity necessary for thermal development under good conditions are between 10,000 and 1,000,000 centipoise in solid phase and below 1000 centipoise in fluid phase of development.

It should also be noted that the energy necessary for the insolation is advantageously between 20 and 1000 mJ/cm$^2$.

Diluents considered as examples, which can also be reactive, are the following, with use of the abridged names of the molecules and classification of them into two distinct families:

Aliphatic and functionalized mono-acrylates and mono-methacrylates with different molecular weights: HEA, HPA, EMA, IBMA, HMA, I-DMA, EMMA, C13MA, C17.4MA, IBOA, HPMA;

Aliphatic and functionalized urethane acrylates, diacrylates and dimethacrylates with different molecular weights: HDDA, TEGDA, TTEGDA, TPGDA, NPGDA, BDDMA, DEGDMA, HDDMA, PG200DMA, N-IBMMAA, GDMA.

Multifunctional urethanes acrylates and methacrylates of the type of: TMPTA, TMPTMA, DTMPTA, DPEMPA.

The invention as described has numerous advantages. Thus, the production of the sleeves, on one hand, and the creation of the image, on the other hand, can be done very rapidly, with perfect registering and without the use of an intermediate film. The wavelength of the laser light used, which is lower than that of the light used up to now, ensures greater spatial resolution. The possibility of developing the sleeve without solvent provides the very important advantage of protecting the environment. Finally, the use of light in the wavelength band between 390 and 410 nm makes it possible to use very high performance laser diodes 4 with relatively low cost of purchasing and maintenance. A large number of photo-initiators sensitive to this wavelength are available. The constraints of protection against daylight are limited. At these wavelengths, the laser beam optics which are used are simple. The direct crosslinking according to the invention has the advantage of requiring less energy than ablation which is a competing digital production technology.

The sleeve according to the invention as described in reference to FIG. 1 can be supplemented by addition of other layers, as already mentioned above, in order to obtain more complex flexographic printing plate arrangements.

Figure 2:
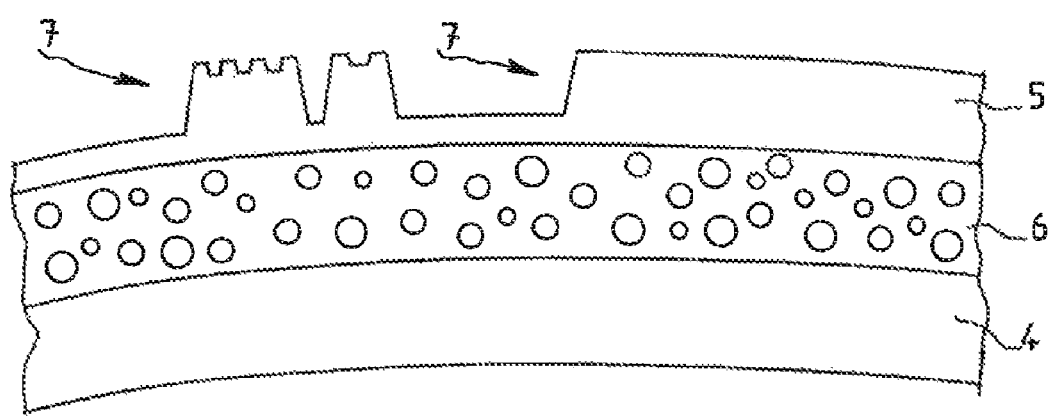
FIG. 2 is a radial view in section with tearing away and on a larger scale of another embodiment of the flexographic printing plate arrangement according to the invention.

Thus, FIG. 2 shows an arrangement in which compressible layer 6 as described in French patent No. 2 803 245 is interposed between light sensitive layer 5 containing the image in relief represented by 7 and composite base 4.

Figure 3:
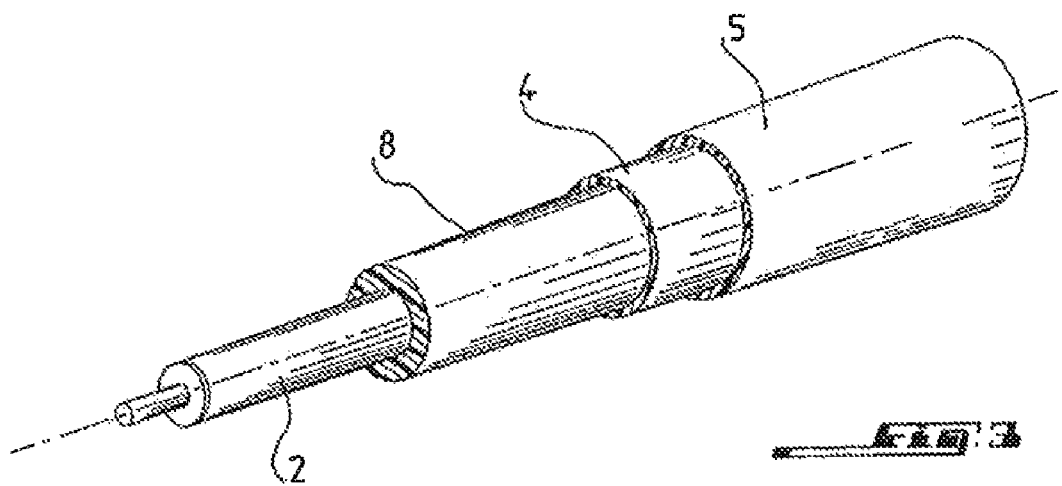
FIG. 3 is a perspective view of yet another embodiment of the flexographic printing plate arrangement according to the invention.

FIG. 3 illustrates the possibility of using, in the manner and for the reasons described in the document EP 0 711 665, inserted sleeve 8 made of a polymer material between support 2 and sleeve 1 formed by base 4 and light sensitive layer 5.

Described in the preceding, as example of implementation of the invention, is a flexographic printing plate arrangement in which this plate is produced in the form of a tubular sleeve. Of course, the arrangement can also be obtained by rolling and attachment of plates on support cylinders or sleeves.

It should be noted that numerous modifications can be made to the invention as just described as an example. In effect, it is possible to use several lasers which act in parallel. The flexographic printing plate can have a base made of polyester film in place of the rigid support. This plate can have two or more layers of light sensitive materials, and it can be capable of being etched with water or with an aqueous solution under pressure, at high temperature or by simple brushing.

The invention claimed is:

1. A method for the producing a flexographic printing plate, which has a base layer and a solid layer of a light sensitive material attached to the base layer, comprising producing an image in the layer of the light sensitive material by selective crosslinking, by insolating zones which are to be crosslinked with amplitude modulated laser light having a wavelength of 390 to 410 nm, and sweeping the layer of the light sensitive material with the amplitude modulated laser light to produced crosslinked zones in the layer of light sensitive material without the use of a mask, and, thereafter, removing zones which are not crosslinked to create the image in the solid layer of the light sensitive material, said solid layer of light sensitive material having a thickness between 0.5 to 2 mm and including at least one photoinitiator sensitive to said laser light at said wavelength, wherein the photoinitiator undergoes a photoreaction under effect of said laser light to bleach the layer of light sensitive material, wherein the bleaching renders the crosslinked zones transparent to said laser light in order to enable cross-linking throughout the thickness of the layer of light sensitive material.

2. The method according to claim 1, including producing the laser light with a laser source consisting of a bundle of diodes producing laser light at wavelengths around 405 nm.

3. The method according to claim 1, including removing the zones which are not crosslinked by liquefying the zones which are not crosslinked thermally, without using solvents.

4. The method according to claim 3, wherein the light sensitive material not crosslinked by the laser light has a variation in viscosity in a temperature range from 60 to 140° C., and the zones that are crosslinked melt at a temperature higher than the temperature range.

5. The method according to claim 1, wherein the light sensitive material contains at least one selected from the group consisting of high molecular weight polymers, functionalized monomers or oligomers, photo-initiators, reactive or non-reactive diluents, inhibitors and protective agents, and pigments.

6. The method according to claim 1, wherein the light sensitive material is a photo-polymer containing at least two complementary crosslinking systems.

7. A method according to claim 6, wherein a main crosslinking system is used to create the image in the solid layer of the light sensitive material.

8. The method according to claim 7, wherein a complementary crosslinking system is used to complete the crosslinking and to increase chemical and mechanical resistance.

9. The method according to claim 6, including using a complementary system to generate different compressibilities.

10. The method according to claim 6, including partially crosslinking the photo-polymer to adjust viscosity and prevent cold creep during prolonged storage periods or transport.

11. The method according to claim 6, including the step of pre-sensitizing the photo-polymer with a flash of light before directly writing an image in the layer of the light sensitive material with the laser light.

12. The method according to claim 1, wherein the light sensitive material is a polymer with a hardness between 60 and 70 ShA.

13. The method according to claim 1, including insolating the light sensitive material with an energy in a range from 20 to 1000 mJ/cm$^2$.

14. The method according to claim 1, including thermally projecting pre-formulated powders onto a support sleeve to produce the plate.

15. The method according to claim 1, including insolating the light sensitive material with a plurality of lasers operating in parallel.

16. A flexographic printing plate obtained according to claim 1, comprising tubular sleeve on a rigid support having a composite base and, attached on the base, the solid polymer layer of light sensitive material, wherein the layer of light sensitive material has a thickness between 0.5 to 2 mm and contains at least one photoinitiator sensitive to laser tight having a wavelength of 390 to 410 nm, wherein the photoinitiator is capable of undergoing a photoreaction under effect of said laser light to bleach the layer of light sensitive material, wherein the bleached light sensitive material permits a progressively deeper penetration of light into the light-sensitive layer in order to provide uniform cross-linking throughout the thickness of the layer of light sensitive material.

17. The flexographic printing plate according to claim 16, wherein the composite base has a thickness in a range from 0.2 to 40 mm.

18. The flexographic printing plate according to claim 16, wherein the sleeve includes a compressible layer.

19. The flexographic printing plate according to claim 16, including a second sleeve containing an inserted layer for variation of thickness of the sleeve.

20. The flexographic printing plate according to claim 19, wherein the inserted layer is compressible.

21. The flexographic printing plate according to claim 16, wherein the tubular sleeve is extruded.

22. The flexographic printing plate according to claim 16, wherein the tubular sleeve is produced by rolling and attachment of a plate to a support cylinder or sleeve.

23. The flexographic printing plate according to claim 16, wherein the tubular sleeve is produced by thermally projecting pre-formulated powders onto a support cylinder or sleeve.

24. The flexographic printing plate according to claim 16, wherein the rigid support includes a base made of polyester film.

25. The flexographic printing plate according to claim 16, including a plurality of the layers of light sensitive material.

26. The flexographic printing plate according to claim 16, wherein the flexographic printing plate is etchable with one of water, an aqueous solution under pressure, high temperature, and brushing.

27. A method for producing a flexographic printing plate, which has a base layer and a solid layer of a light sensitive material attached to the base layer, comprising producing an image in the layer of the light sensitive material by selective crosslinking, by insolating zones which are to be crosslinked with amplitude modulated laser light having a wavelength of 390 to 410 nm, and sweeping the layer of the light sensitive material with the laser light to produce crosslinked zones in the layer of light sensitive material without the use of a mask, and, thereafter, removing zones which are not crosslinked to create the image in the solid layer of the light sensitive material, said solid layer of light sensitive material having a thickness between 0.5 to 2 mm and including at least one material selected from the group consisting of high molecular weight polymers, functionalized monomers or oligomers and at least one photoinitiator, wherein the photoinitiator is sensitive to said laser light at said wavelength and is capable of producing a bleaching effect during a photoreaction in response to said laser light, wherein the bleaching ensures transparency of the crosslinked zones to the laser light in order to enable crosslinking throughout the thickness of the layer of light sensitive material.

28. A flexographic printing plate obtained according to claim 27, comprising a tubular sleeve on a rigid support having a composite base and, attached on the base, the layer of solid polymer light sensitive material, where the layer of light sensitive material has a thickness between 0.5 to 2 mm and contains at least one photoinitiator sensitive to laser light having a wavelength of 390 to 410 nm, wherein the photoinitiator is capable of undergoing a photoreaction under effect of said laser light to bleach the layer of light sensitive material, wherein the bleached light sensitive material permits a progressively deeper penetration of the light into the light sensitive layer in order to provide uniform cross-linking throughout the thickness of the layer of light sensitive material.

* * * * *

UNITED STATES PATENT AND TRADEMARK OFFICE
CERTIFICATE OF CORRECTION

PATENT NO. : 8,196,510 B2  Page 1 of 1
APPLICATION NO. : 10/500635
DATED : June 12, 2012
INVENTOR(S) : Jerzy Kuczynski et al.

It is certified that error appears in the above-identified patent and that said Letters Patent is hereby corrected as shown below:

Column 4, Line 25

Delete "light to produced" and replace it with -- light to produce --

Column 5, Line 26

Delete "to laser tight" and replace it with -- to laser light --

Signed and Sealed this
Twenty-fourth Day of July, 2012

David J. Kappos
*Director of the United States Patent and Trademark Office*